United States Patent
Takinami et al.

(10) Patent No.: US 8,140,030 B2
(45) Date of Patent: Mar. 20, 2012

(54) ADAPTIVE IMPEDANCE CONVERTER ADAPTIVELY CONTROLS LOAD IMPEDANCE

(75) Inventors: Koji Takinami, Saratoga, CA (US); Paul Cheng-Po Liang, Santa Clara, CA (US)

(73) Assignee: Panasonic Corporation, Osaka (JP)

( * ) Notice: Subject to any disclaimer, the term of this patent is extended or adjusted under 35 U.S.C. 154(b) by 793 days.

(21) Appl. No.: 12/209,981

(22) Filed: Sep. 12, 2008

(65) Prior Publication Data

US 2010/0069025 A1    Mar. 18, 2010

(51) Int. Cl.
 *H04B 1/02* (2006.01)
 *H04B 1/04* (2006.01)
 *H01Q 11/12* (2006.01)
(52) U.S. Cl. ...... 455/108; 455/110; 455/113; 455/127.1
(58) Field of Classification Search .................. 455/107, 455/121, 129, 269, 197.3, 93, 110, 113, 120, 455/123, 125, 127.1, 139
See application file for complete search history.

(56) References Cited

U.S. PATENT DOCUMENTS

| | | | | |
|---|---|---|---|---|
| 7,030,714 B2 * | 4/2006 | Korol | | 333/124 |
| 7,378,902 B2 * | 5/2008 | Sorrells et al. | | 330/2 |
| 7,761,065 B2 * | 7/2010 | Drogi et al. | | 455/126 |
| 7,821,273 B2 * | 10/2010 | Van Bezooijen et al. | | 324/646 |
| 2004/0135630 A1 * | 7/2004 | Hellberg | | 330/149 |
| 2005/0073374 A1 * | 4/2005 | Korol | | 333/124 |
| 2006/0017500 A1 * | 1/2006 | Hellberg | | 330/124 R |

* cited by examiner

*Primary Examiner* — Andrew Wendell
*Assistant Examiner* — Cindy Trandai

(57) ABSTRACT

A transmitter generates first and second constant-envelope radio frequency (RF) component signals having first and second phase angles. The first and second phases are controlled by a phase controller. First and second nonlinear power amplifiers (PAs) are modulated by an amplitude-modulated power supply signal as the first and second constant-envelope RF component signals are amplified. The phase controller controls the first and second phases of the first and second constant-envelope RF component signals, in response to a power control signal, and, in so doing, controls an effective load impedance seen at the outputs of the first and second nonlinear PAs. By controlling the effective load impedance in response to a power control signal, rather than in response to rapid amplitude variations in an input signal envelope, the output power of the transmitter is efficiently controlled over a wide dynamic range even at low output powers.

6 Claims, 5 Drawing Sheets

ADAPTIVE IMPEDANCE CONVERTER ADAPTIVELY CONTROLS LOAD IMPEDANCE

FIELD OF THE INVENTION

The present invention relates to communications transmitters. More specifically, the present invention relates to methods and apparatus for generating and transmitting communications signals at high efficiencies and over wide dynamic ranges of controlled power.

BACKGROUND OF THE INVENTION

Achieving high power efficiency is one of the most important goals in the design of the transmitter of a battery-powered wireless communications device, such as a cellular handset. The dominant consumer of power in the transmitter is usually the transmitter's power amplifier (PA). For this reason, efforts to improve the efficiency of the transmitter have focused in large part on ways to improve the efficiency of the PA.

The efficiency of a PA can be increased by operating the PA close to, or in, saturation. However, this approach is effective only if the signal applied to the PA has a constant envelope. Many existing or soon-to-be deployed technologies, such as Wideband Code Division Multiple Access (W-CDMA), High-Speed Packet Access (HSPA) and Long Term Evolution (LTE) cellular technologies, employ nonconstant-envelope signals in an effort to increase spectral efficiency. To maintain linearity and prevent the signal peaks of these nonconstant-envelope signals from being clipped as the signals are amplified by the PA, the signal levels must first be reduced before they are applied to the input of the PA and the PA must be operated in its linear region. Unfortunately, these requirements result in a substantial reduction in efficiency.

One approach that can be used to avoid the efficiency versus linearity trade-off of conventional linear-amplifier-based transmitter is to employ what is known as a polar transmitter. In a polar transmitter, the amplitude information (i.e., the signal envelope) is temporarily removed from the nonconstant-envelope signals, so that the polar transmitter's PA can be configured to operate in its nonlinear region where it is more efficient at converting power from the transmitter's power supply into RF power than when configured to operate in its linear region.

FIG. 1 is a simplified drawing of a typical polar transmitter 100. The polar transmitter 100 includes an amplitude modulator 102 configured in an amplitude modulation (AM) path; a phase modulator 104 configured in a phase modulation (PM) path; and a PA 106. The amplitude modulator 102 is configured to receive an AM signal AM(t) containing the signal envelope, while the phase modulator 104 is configured to receive a PM signal PM(t) containing the phase modulation. The amplitude modulator 102 operates to modulate a direct current (DC) power supply Vsupply according to amplitude variations in the AM signal AM(t). The resulting amplitude-modulated power supply signal Vs(t) is coupled to the power supply port of the PA 106. Meanwhile, the phase modulator 104 operates to modulate an RF carrier signal according to the phase modulation in the PM signal PM(t). The resulting phase-modulated RF carrier signal RFin has a constant envelope and is coupled to the RF input port of the PA 106.

Because the phase-modulated RF carrier signal RFin has a constant envelope, the PA 106 can be configured to operate in its nonlinear region of operation, where it is more efficient at converting power from the DC power supply Vsupply into RF power than is the PA of a conventional linear amplifier. Typically, the PA 106 is formed as a Class D, E or F switch-mode PA 106 operating in compression (i.e., "compressed mode"), so that the power supply port of the PA 106 is modulated according to amplitude variations in the amplitude-modulated power supply signal Vs(t). By modulating the power supply port of the PA 106, the AM in the original AM signal AM(t) is restored in the output signal RFout of the PA 106 as the PA 106 operates to amplify the phase-modulated RF carrier signal RFin.

Although the polar transmitter 100 does achieve a significantly higher efficiency compared to linear-amplifier-based transmitters, its utility can be limited in applications that require a wide range of controllable output powers. Some wireless communications applications require that the transmitter of a wireless communications device to be capable of controlling the transmitter average output power $P_{out}$ over a wide dynamic range. For example, the W-CDMA standard requires the average output power $P_{out}$ of the transmitter of a cellular handset to be controllable over a range of about +24 dBm to −50 dBm, i.e., over a 70 dB range.

The difficulty the polar transmitter 100 has in controlling average output $P_{out}$ over a wide dynamic range is due in part to the difficulty in designing an amplitude modulator 102 that can control the amplitude of the amplitude-modulated power supply signal Vs(t) over a wide dynamic range. When the PA 106 is a switch-mode PA operating in compressed mode, the average output power $P_{out}$ of the polar transmitter 106 depends on the amplitude (specifically, the square of the amplitude) of the amplitude-modulated power supply signal Vs(t) applied to the power supply port of the PA 106. Consequently, how effective the polar transmitter 100 is at controlling the average output power $P_{out}$ depends, at least in part, on how effective the amplitude modulator 102 is at controlling the amplitude of the amplitude-modulated power supply signal Vs(t).

Various types of amplitude modulator circuits have been proposed for use in the polar transmitter 100. Most are designed with the goal of maximizing efficiency, so as not to sacrifice the efficiency gains achieved by being able to operate the PA 106 as a nonlinear PA. While some types of amplitude modulator circuits are highly efficient, most do not succeed in the ability of the amplitude modulator 102 to control the amplitude of the amplitude-modulated power supply signal Vs(t) over the range of amplitudes necessary to control the average output power $P_{out}$ over the wide dynamic ranges required by standards. Controllability is particularly difficult when the average output power $P_{out}$ to be controlled is low, such as at −50 dBm in the W-CDMA standard.

The ability of the polar transmitter 100 to control the average output power $P_{out}$ over a wide dynamic range is also encumbered by the physical characteristics of the PA 106. As explained above, the PA 106 in the polar transmitter 100 operates as a switch, typically formed from a field-effect transistor (FET). In any FET, a stray capacitance is formed between the input and output of the FET (e.g., between the gate and drain). This stray capacitance provides a leakage path from the gate (to which the phase-modulated RF carrier signal RFin is coupled) to the drain (which serves as the output of the PA 106), which results in the PA 106 having a nonlinear response at low average output powers $P_{out}$.

The dynamic range limitation of the PA 106 results in spectral regrowth outside the desired or allocated transmission band. At low average output powers $P_{out}$, where distortion is most severe, the degree of spectral regrowth can be significant enough that compliance with standards is not possible. Hence, as a practical matter, the ability of the polar transmitter 100 to control average output power $P_{out}$ over a wide dynamic range in compressed mode is limited by distortion at low average output powers $P_{out}$.

One approach that can be used to extend the range of average output power control of the polar transmitter 100 to lower average output powers $P_{out}$ is to operate the PA 106 in what is referred to as "product mode" (or "multiplicative mode") during times when the polar transmitter 100 is to transmit at a low average output power $P_{out}$, instead of operating the PA 106 in compressed mode. Such an approach is described in U.S. Pat. No. 7,010,276 to Sander et al. Unlike in compressed mode where the average output power $P_{out}$ of the polar transmitter 100 is determined solely by the amplitude of the amplitude-modulated power supply signal Vs(t) applied to the power supply port of the PA 106, in product mode, the PA 106 is operated in its deep triode region where the average output power $P_{out}$ is determined not just by the amplitude of the amplitude-modulated power supply signal Vs(t) but by the product of the amplitude-modulated power supply signal Vs(t) and the amplitude of the phase-modulated RF carrier signal RFin applied to the RF input port of the PA 106. The extra dimension of power control available in product mode affords the ability to extend the range of average output power control to average output powers $P_{out}$ below that which can be controlled by the PA 106 when operating in compressed mode. However, this is accomplished at the expense of efficiency, since, as illustrated in FIG. 2, the PA 106 operates less efficiently in product mode than it does when operating in compressed mode.

Considering the drawbacks and limitations of conventional communications transmitters described above, it would be desirable to have methods and apparatus for generating and transmitting communications signals that are capable of controlling average output power over a wide dynamic range but which do not require a sacrifice in efficiency at low average output powers $P_{out}$.

SUMMARY OF THE INVENTION

Methods and apparatus for generating and transmitting communications signals at high efficiencies and over wide dynamic ranges of controlled output powers are disclosed. An exemplary transmitter includes a signal separator, a phase controller, a first nonlinear power amplifier (PA), a second nonlinear PA, and a combiner. The signal separator operates to generate first and second constant-envelope RF component signals. The first and second constant-envelope RF component signals have first and second phase angles, which may be modulated (in terms of angle (i.e., frequency or phase) and/or amplitude) or may be unmodulated. The power supply ports of the first and second nonlinear PAs are modulated by an amplitude-modulated power supply signal as the first and second constant-envelope RF component signals are amplified by the first and second nonlinear PAs, thereby generating first and second amplitude-modulated RF signals.

The phase controller is configured to control the first and second phases of the first and second constant-envelope RF component signals, and, in so doing, an effective load impedance $Z_{out}$ seen at the outputs of the first and second nonlinear PAs. Further, the phase controller is responsive to a power control signal indicative of an average output power $P_{out}$ the transmitter is to transmit.

The power control signal controls the first and second phase angles of the first and second constant-envelope RF component signals independent of the amplitude of the RF input signal, the amplitude of the amplitude-modulated power supply signal, the amplitude of the first and second amplitude-modulated RF signals, or the amplitude of the modulated RF output signal. The power control signal also varies slowly over time compared to amplitude variations in these signals. According to one embodiment of the invention, the reactive component of the effective load impedance $Z_{out}$ is reduced by coupling variable shunt reactances at the RF outputs of the first and second nonlinear PAs. The reactances of the variable shunt reactances are adaptively controlled by the phase controller in response to the power control signal. Because the reactances of the variable shunt reactances are controlled by the slowly-varying power control signal, the effective load impedance $Z_{out}$ can be optimized for a wide range of average output powers $P_{out}$. Further, nonlinear effects caused by the variable shunt reactances' inability or difficulty to respond quickly enough to rapid amplitude changes in the input signal envelope are avoided.

By controlling the effective load impedance $Z_{out}$ and average output power $P_{out}$ based on the power control signal, the transmitter is able to operate over a wide dynamic range without requiring a sacrifice in efficiency at low average output powers $P_{out}$. There is no need to scale down the AM signal AM(t) or operate the nonlinear PAs in product mode in order to provide and control low average output powers $P_{out}$. The first and second nonlinear PAs can be operated in compressed mode where they are highly efficient, even when the transmitter is configured to transmit at low average output powers $P_{out}$.

Further features and advantages of the present invention, including a description of the structure and operation of the above-summarized and other exemplary embodiments of the invention, are described in detail below with respect to accompanying drawings, in which like reference numbers are used to indicate identical or functionally similar elements.

DETAILED DESCRIPTION

Figure 3:
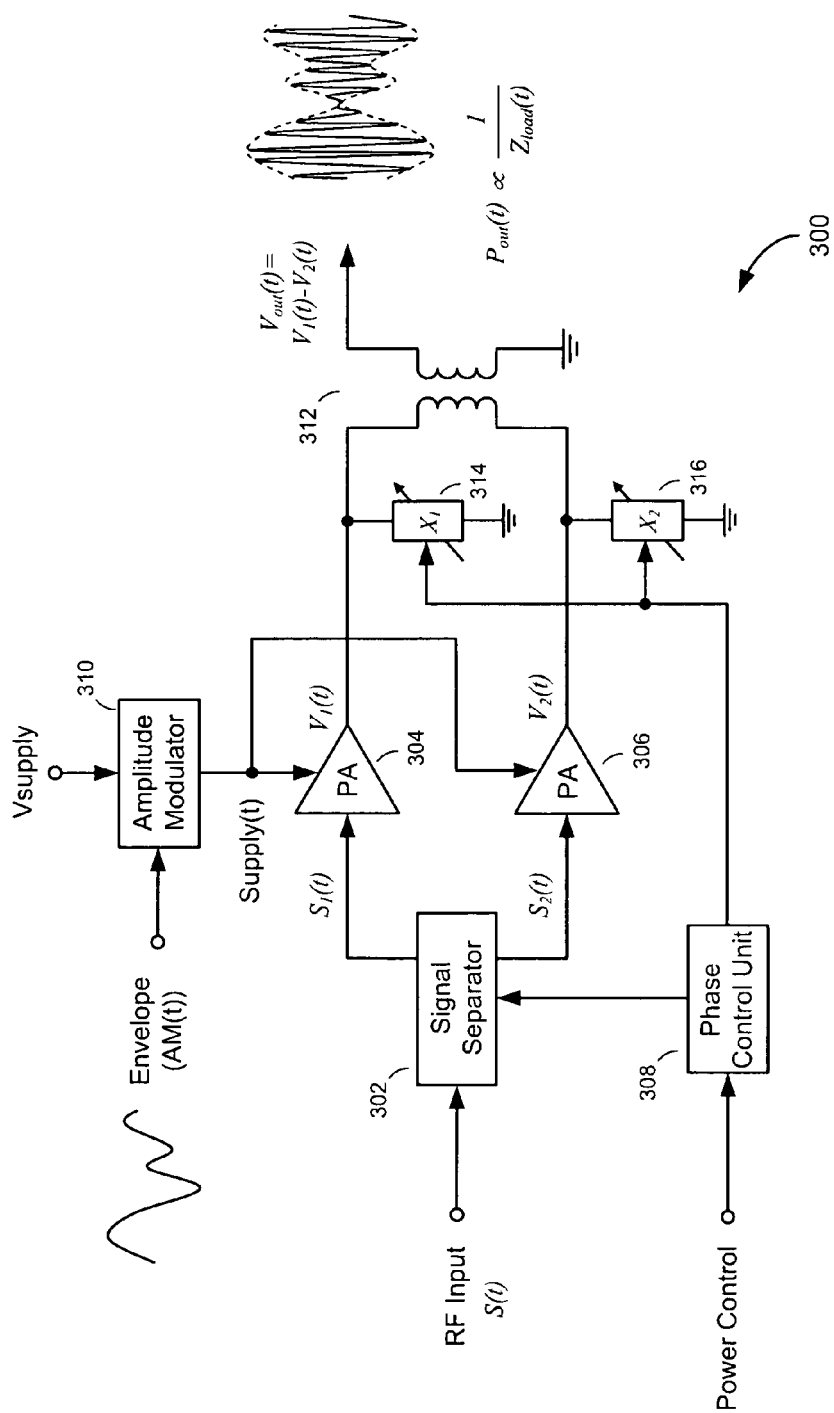
FIG. 3 is a drawing of a transmitter, according to an embodiment of the present invention.

Referring to FIG. 3, there is shown a transmitter 300, according to an embodiment of the present invention. The transmitter 300 comprises a signal separator 302, first and second power amplifiers (PAs) 304 and 306, a phase control unit 308, an amplitude modulator 310, a transformer 312, and first and second variable shunt reactances 314 and 316.

Figure 4:
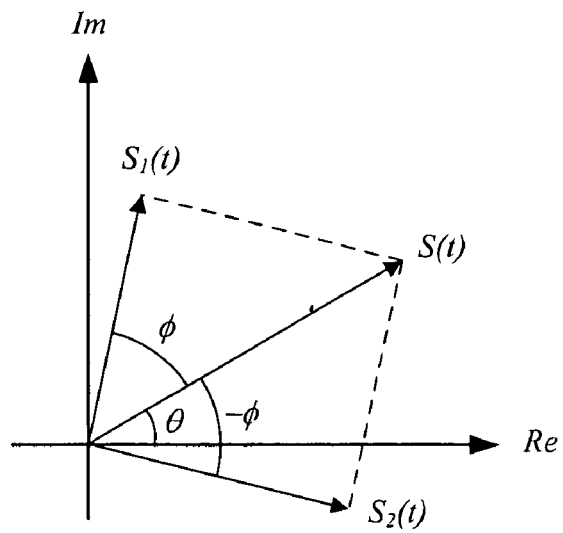
FIG. 4 is a complex-plane phasor diagram showing the phase relationship of the RF input signal S(t) applied to the signal separator of the transmitter in FIG. 3 and the signals $S_1(t)$ and $S_2(t)$ produced at the output of the signal separator.

The signal separator 302 is configured to receive a radio frequency (RF) input signal S(t) and generate therefrom first and second constant-envelope RF component signals $S_1(t)$ and $S_2(t)$ having opposite (i.e., first and second) phase angles $+\phi(t)$ and $-\phi(t)$ relative to the phase of the RF input signal S(t). The vector sum of the first and second constant-envelope RF component signals $S_1(t)$ and $S_2(t)$ relates to the RF input signal S(t) as shown in the phasor diagram in FIG. 4. In the description of the exemplary embodiment that follows, it is assumed that the RF input signal S(t) is a phase-modulated RF signal having phase modulation θ(t). However, depending on the application or the modulation format used, the RF input signal S(t) may be modulated (in terms of angle (i.e., frequency or phase) and/or amplitude) or may be unmodulated.

The first and second phase angles $+\phi(t)$ and $-\phi(t)$ of the first and second constant-envelope RF component signals $S_1(t)$ and $S_2(t)$ are determined by the phase control unit 308, in response to a power control signal indicating the average output power $P_{out}$ of the transmitter 300. The first and second constant-envelope RF component signals $S_1(t)$ and $S_2(t)$ are coupled to the RF inputs of the first and second PAs 304 and 306, which are nonlinear PAs configured to operate at peak or near-peak efficiency across a wide range of average output powers $P_{out}$. In one embodiment, the first and second PAs 304 and 306 are identical or substantially identical (e.g., formed on the same semiconductor substrate and/or manufactured according to the same semiconductor fabrication process), and comprise Class D, E or F switch-mode PAs configured to operate in compression (i.e., "compressed mode").

The amplitude modulator 310 operates to amplitude modulate a direct current power supply signal Vsupply, based on amplitude variations in an amplitude modulation (AM) signal AM(t), which may be detected or removed from the RF input signal S(t) if the RF input signal is presented in the form of a nonconstant-envelope signal, or may be generated independent of the RF input signal S(t). Any suitable high-efficiency amplitude modulator may be used to implement the amplitude modulator 310. For example, a switching regulator or a switch-mode type of amplitude modulator, such as a Class S modulator, may be used. The resulting amplitude-modulated power supply signal Supply(t) is coupled to the power supply ports of both the first and second PAs 304 and 306. With the first and second PAs 304 and 306 implemented as switch-mode PAs operating in compressed mode, the first and second PAs 304 and 306 operate to impress the AM in the amplitude-modulated power supply signal Supply(t) onto the first and second constant-envelope RF component signals $S_1(t)$ and $S_2(t)$ as the first and second constant-envelope RF component signals $S_1(t)$ and $S_2(t)$ are amplified by the first and second PAs 304 and 306. Accordingly, first and second amplitude- and phase-modulated RF signals $V_1(t)$ and $V_2(t)$ (or first and second amplitude-modulated-only RF signals $V_1(t)$ and $V_2(t)$, if the RF input signal contains no phase modulation) are provided at the outputs of the first and second PAs 304 and 306.

The transformer 312 operates to add the first and second amplitude- and phase-modulated RF signals $V_1(t)$ and $V_2(t)$, which, like the first and second constant-envelope RF component signals $S_1(t)$ and $S_2(t)$ have phase angles $+\phi(t)$ and $-\phi(t)$. Depending on the phase relationship between the phase angles $+\phi(t)$ and $-\phi(t)$ the first and second amplitude- and phase-modulated RF signals $V_1(t)$ and $V_2(t)$ constructively or destructively combine to produce a transmitter RF output signal $V_{out}(t)=V_1(t)+V_2(t)$ at the secondary winding of the transformer 312. The transmitter RF output signal $V_{out}(t)$ is applied to a load (e.g., an antenna). Whereas a transformer 312 is used in this exemplary embodiment, other types of combiners, such as quarter-wave transmission lines similar to those used in Chireix outphasing transmitter systems, may be alternatively used, as will be appreciated by those of ordinary skill in the art.

The power level of the transmitter RF output signal $V_{out}(t)$ is determined by the angular separation between the first and second phase angles $+\phi(t)$ and $-\phi(t)$ in the first and second amplitude- and phase-modulated RF signals $V_1(t)$ and $V_2(t)$. For example, when $+\phi(t)=90°$ and $-\phi(t)=-90°$, the first and second amplitude- and phase-modulated RF signals $V_1(t)$ and $V_2(t)$ directly oppose one another and the power level of the transmitter RF output signal $V_{out}(t)$ is at its minimum. Conversely, when $\phi(t)=0°$, the first and second amplitude- and phase-modulated signals $V_1(t)$ and $V_2(t)$ are in phase and the power level of the transmitter RF output signal $V_{out}(t)$ is at its maximum.

The first and second variable shunt reactances 314 and 316 operate in cooperation with the transformer 312 to cancel out the reactive component of the effective load impedance $Z_{load}$ seen by the first and second PAs 304 and 306. The reactances of the first and second variable shunt reactances 314 and 316 are controlled by the phase control unit 308, in response to the power control signal, and in one embodiment are dependent on the angular separation between the first and second phase angles $+\phi(t)$ and $-\phi(t)$ of the first and second constant-envelope RF component signals $S_1(t)$ and $S_2(t)$. Techniques which may be adapted to determine the capacitive and/or inductive characteristics of the first and second variable shunt reactances 314 and 316, are set forth in U.S. Pat. No. 5,345,189, which is hereby incorporated herein by reference.

Figure 5:
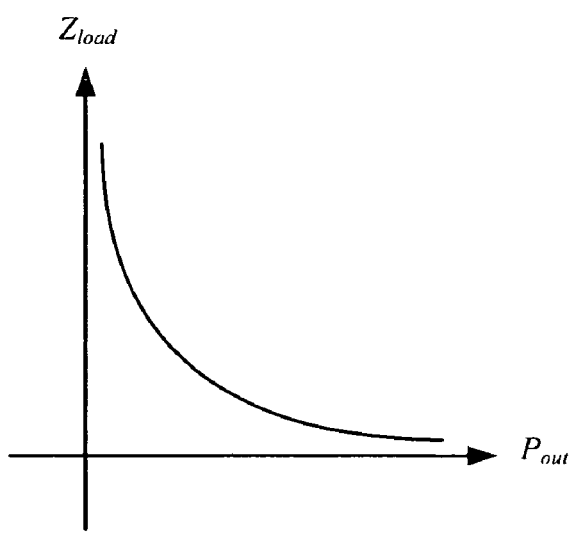
FIG. 5 is a graph illustrating how the average output power $P_{out}$ of the transmitter in FIG. 3 relates to the effective load impedance $Z_{load}$ as seen at the RF output ports of the transmitter's PAs.

As the transmitter 300 operates, the phase control unit 308 adaptively adjusts the reactances of the first and second variable shunt reactances 314 and 316, so that the imaginary (i.e., reactive component) of the effective load impedance $Z_{load}$ is minimized. The result of the reactance-canceling function provided by the variable shunt reactances 314 and 316 results in an effective load impedance $Z_{load}$ that is purely resistive and inversely related to the average output power $P_{out}$ of the transmitter 300, as illustrated in the graph in FIG. 5.

Minimizing the reactive component of the effective load impedance $Z_{load}$ allows power transfer to the actual load to be maximized. Varying the reactances of the variable shunt reactances 314 and 316 as a function of the power control signal also allows the efficiency of the transmitter 300 to be optimized over a wide range of average output powers $P_{out}$.

The power control signal applied to the phase control unit 308 is indicative of the average output power $P_{out}$ of the transmitter 300. The power control signal may be based on past, present, and/or expected average output power level(s) $P_{out}$. According to one embodiment, the power control signal adaptively controls the first and second phase angles phase angles $+\phi(t)$ and $-\phi(t)$ of the first and second constant-envelope RF component signals $S_1(t)$ and $S_2(t)$ independent of amplitude variations in the RF input signal S(t), the AM signal AM(t), amplitude-modulated power supply signal Supply(t), and the first and second amplitude- and phase-modulated RF signals $V_1(t)$ and $V_2(t)$, and the power control signal is a signal that varies slowly over time compared to the rate of amplitude variation in these amplitude-varying signals. The slow-varying power control signal is exploited to control the average output $P_{out}$ of the transmitter, independent of amplitude variations in the various amplitude-varying signals referred to above. In one embodiment, the power control signal is based on a transmit power control (TPC) command from an external power controlling apparatus such as a cellular base station.

Another significant benefit of using the slow-varying power control signal to control the average output power $P_{out}$, rather than the instantaneous level changes in the signal envelope of the RF input signal S(t) (as is typically done in conventional linear amplification using nonlinear components (LINC) and Chireix transmitters), is that distortion resulting from the inability of the variable shunt reactances 314 and 316 to respond to fast level changes in the signal envelope of the RF input signal S(t) (or other amplitude modulation carrying signals in the transmitter 300) is avoided.

Figure 6:
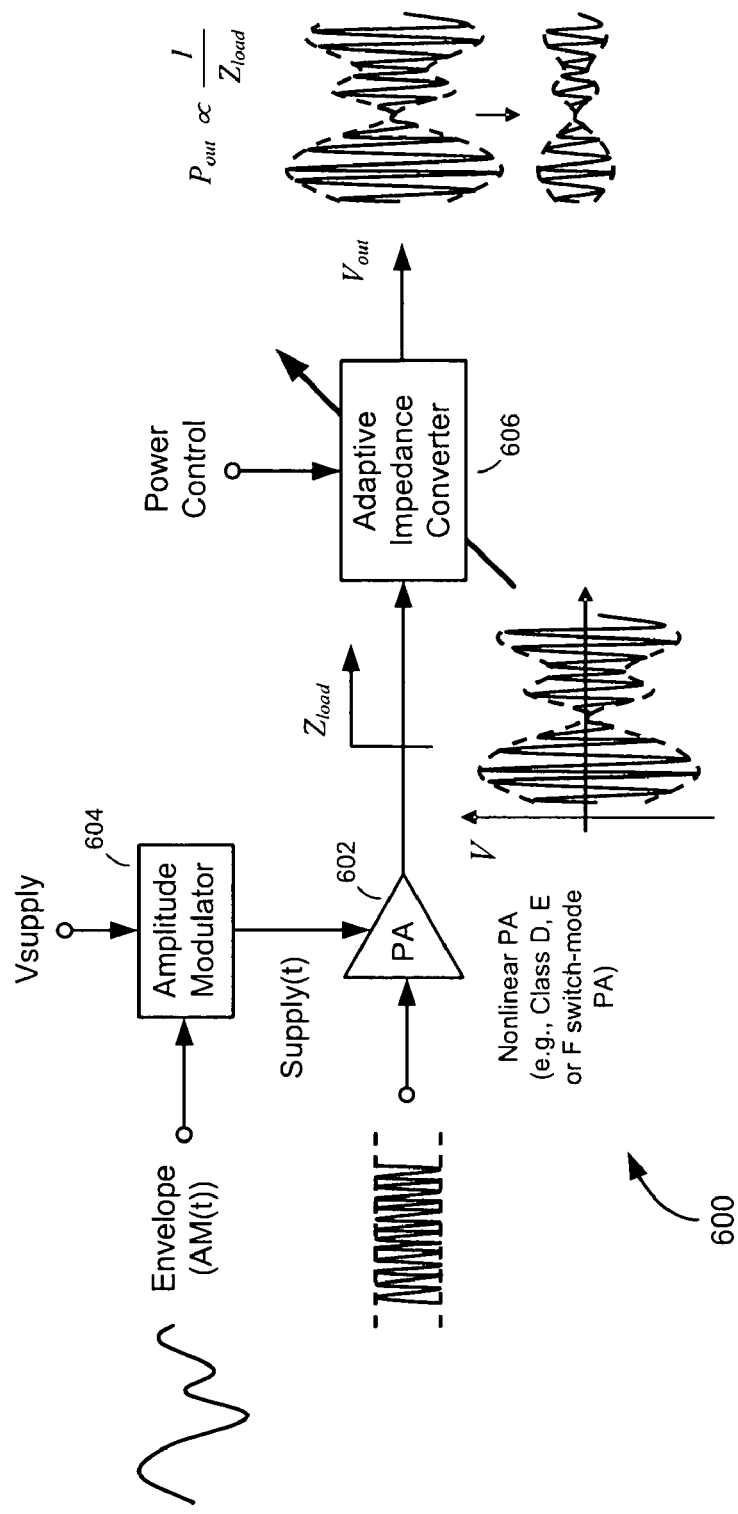
FIG. 6 is a drawing of a transmitter, according to an embodiment of the present invention.

FIG. 6 is a drawing of a transmitter 600 generalizing the various features of the exemplary transmitter 300 in FIG. 3. The transmitter 600 comprises a PA 602, an amplitude modulator 604, and an adaptive impedance converter 606. The amplitude modulator 604 operates to modulate a DC power supply Vsupply according to amplitude variations in an envelope signal (e.g., an AM signal AM(t)), to generate an amplitude-modulated power supply signal Supply(t), which is coupled to the power supply port of the PA 602. An RF input signal, which may be angle (i.e., phase or frequency) modulated, angle and amplitude-modulated, or unmodulated, depending on the application or communications standard being employed, is coupled to the RF input of the PA 602.

Similar to the PAs 304 and 306 of the transmitter 300 in FIG. 3, the PA 602 of the transmitter 600 in FIG. 6 comprises a nonlinear PA configured to operate at (or near) its peak efficiency. According to one embodiment the PA 602 comprises a switch-mode PA (e.g., a Class D, E or F switch-mode PA) configured to operate in compression, so that the AM in the amplitude-modulated power supply signal Supply(t) is impressed on the RF input signal as it is amplified by the PA 602, thereby forming an amplitude-modulated RF output signal at the RF output port of the PA 602. Depending on whether the RF input signal is angle-modulated, the amplitude-modulated RF output signal may also be angle modulated.

The RF output signal is coupled through the adaptive impedance converter 606 to a load (not shown) across which a transmitter output voltage $V_{out}$ is applied. The average output power $P_{out}$ of the transmitter 600 is controlled by the adaptive impedance converter 606, in response to the power control signal, and is inversely related to the effective load impedance $Z_{load}$ seen from the output of the PA 602 (similar to as in FIG. 5).

Figure 1:
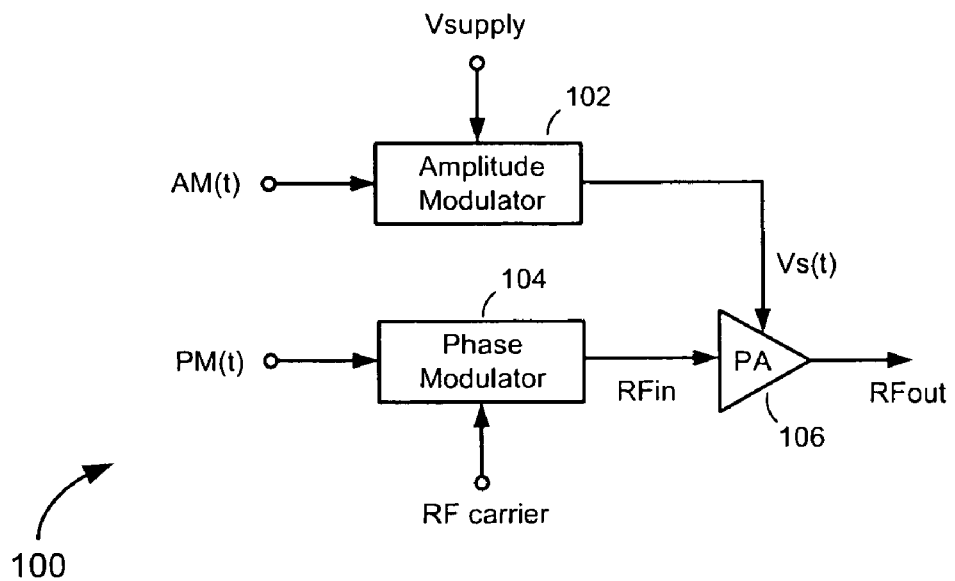
FIG. 1 is a simplified drawing of a conventional polar transmitter.
Figure 2:
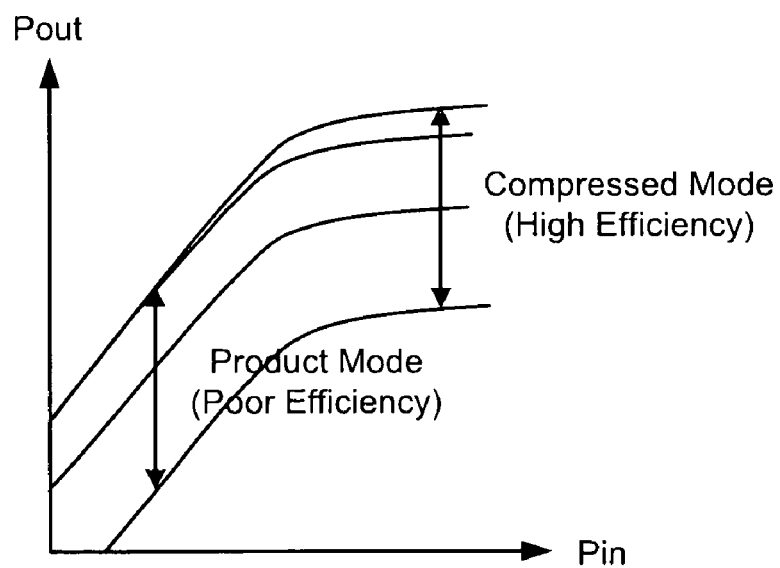
FIG. 2 is a graph of the input-output power characteristics of the power amplifier (PA) of the polar transmitter in FIG. 1, illustrating how the PA is more efficient at converting direct current (DC) power from the transmitter's power supply to radio frequency (RF) power when the PA is configured to operate in a compressed mode compared to when configured to operate in a product mode.
Figure 7:
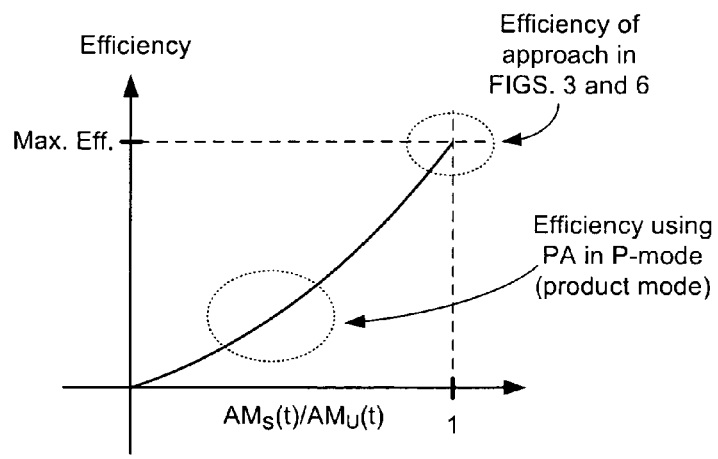
FIG. 7 is a graph comparing the efficiency of the transmitter of the present invention (exemplary embodiments in FIGS. 3 and 6) to the efficiency of the conventional polar transmitter in FIG. 1.
Figure 8:
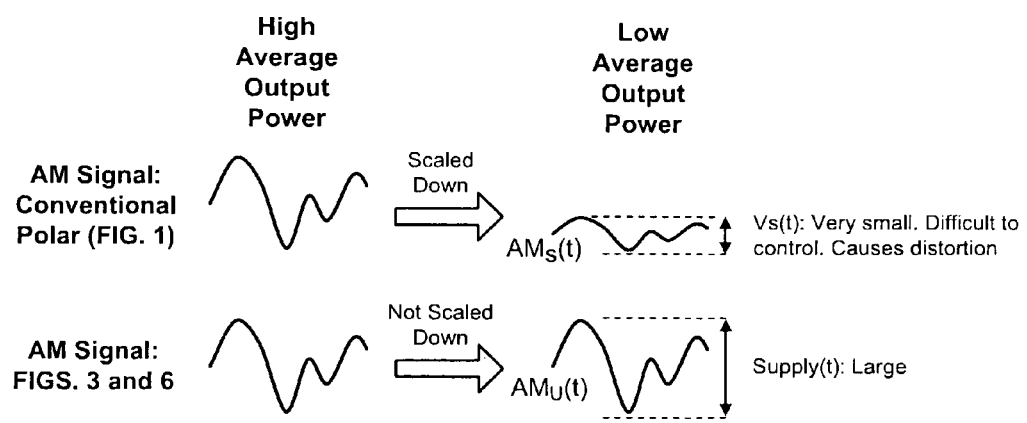
FIG. 8 is a drawing illustrating how the amplitude modulation (AM) signal of the conventional polar transmitter in FIG. 1 is scaled down in an effort to expand the dynamic range of power control, the negative consequences of scaling down the AM signal, and how the AM signal in the transmitters of the present invention does not require scaling down to realize a wide dynamic range in output power control.

FIG. 7 is a graph comparing the efficiency of the transmitters of the present invention (exemplary embodiments in FIGS. 3 and 6) to the efficiency of the conventional polar transmitter in FIG. 1 as a function of a scaled AM signal $AM_S(t)$ (normalized to an unscaled AM signal $AM_U(t)$), i.e., $AM_S(t)/AM_U(t)$. As can be seen, the efficiency of the conventional polar transmitter is much lower than the efficiency of the transmitter of the present invention, since the AM must be scaled down in order for the conventional polar transmitter to generate and control low average output powers $P_{out}$. By contrast, no scaling down of the AM is necessary to achieve low average output power $P_{out}$ in the transmitters of the present invention. In fact, $AM_S(t)/AM_U(t)=1$ for all average output powers $P_{out}$, even low average output powers $P_{out}$. Maximum efficiency is therefore achieved over a wide dynamic range of average output powers $P_{out}$. This benefit of the present invention and the drawbacks associated with having to scale the AM to achieve low average output powers $P_{out}$ in the conventional polar transmitter are further illustrated in FIG. 8.

Although the present invention has been described with reference to specific embodiments, these embodiments are merely illustrative and not restrictive of the present invention. Further, various modifications or changes to the specifically disclosed exemplary embodiments will be suggested to persons skilled in the art and are to be included within the spirit and purview of this application and scope of the appended claims.

What is claimed is:

1. A transmitter, comprising:
an amplitude modulator configured to amplitude-modulate a power supply signal according to amplitude variations in an amplitude modulation signal;
a nonlinear power amplifier (PA) having a radio frequency (RF) input port configured to receive an RF input signal, a power supply port configured to receive the amplitude-modulated power supply signal from said amplitude modulator, and an RF output port, said nonlinear PA operable to produce an amplitude-modulated RF signal at its RF output port based on amplitude variations in said amplitude-modulated power supply signal; and
an adaptive impedance converter configured to control an effective load impedance appearing at the RF output port of the nonlinear PA,
said adaptive impedance converter being configured to control the effective load impedance appearing at the RF output port of the nonlinear PA in response to a power control signal indicative of an average transmitter output power.

2. The transmitter of claim 1 wherein the adaptive impedance converter's control of the effective load impedance in response to the power control signal allows the average transmitter output power to be controlled independent of amplitude variations in the RF input signal, if any, or amplitude variations in the amplitude modulation signal.

3. The transmitter of claim 1 wherein the RF input signal is an angle-modulated RF input signal and an RF output signal produced by said adaptive impedance converter is an amplitude- and angle-modulated RF output signal.

4. The transmitter of claim 3 wherein amplitude modulation in the amplitude- and angle-modulated RF output signal is derived from the nonlinear PA's response to the amplitude-modulated power supply signal and the average transmitter output power is controlled by the adaptive impedance converter's control of the effective load impedance appearing at the RF output port of the nonlinear PA.

5. A method of generating and transmitting a modulated radio frequency (RF) signal, comprising:
amplifying an RF input signal using a nonlinear power amplifier (PA);
modulating a power supply port of the nonlinear PA with an amplitude-varying power supply signal as the RF input signal is being amplified; and
in response to a power control signal, adaptively controlling, with an adaptive impedance converter, an effective load impedance seen from the RF output port of the nonlinear PA,
the power control signal being slowly varying over time compared to amplitude variations in the amplitude-varying power supply signal.

6. A method of generating and transmitting a modulated radio frequency (RF) signal, comprising:
- amplifying an RF input signal using a nonlinear power amplifier (PA);
- modulating a power supply port of the nonlinear PA with an amplitude-varying power supply signal as the RF input signal is being amplified; and
- in response to a power control signal, adaptively controlling an effective load impedance seen from the RF output port of the nonlinear PA,
- adaptively controlling the effective load impedance including reducing a reactive component of the effective load impedance,
- reducing the reactive component of the effective load impedance being performed in response to the power control signal, and
- adaptively controlling, with an adaptive impedance converter, the effective load impedance seen from the RF output port of the nonlinear PA being performed to adaptively control an average output power supplied to an external load independent of amplitude variations in the RF input signal, if any, of amplitude variations in an amplitude-varying signal that has been removed from the RF input signal or amplitude variations in an amplitude-varying signal that tracks amplitude variations in the RF input signal.

* * * * *